Oct. 6, 1970 R. W. EMBLEY 3,533,004
FEED FORWARD AMPLIFIER
Filed Nov. 13, 1968
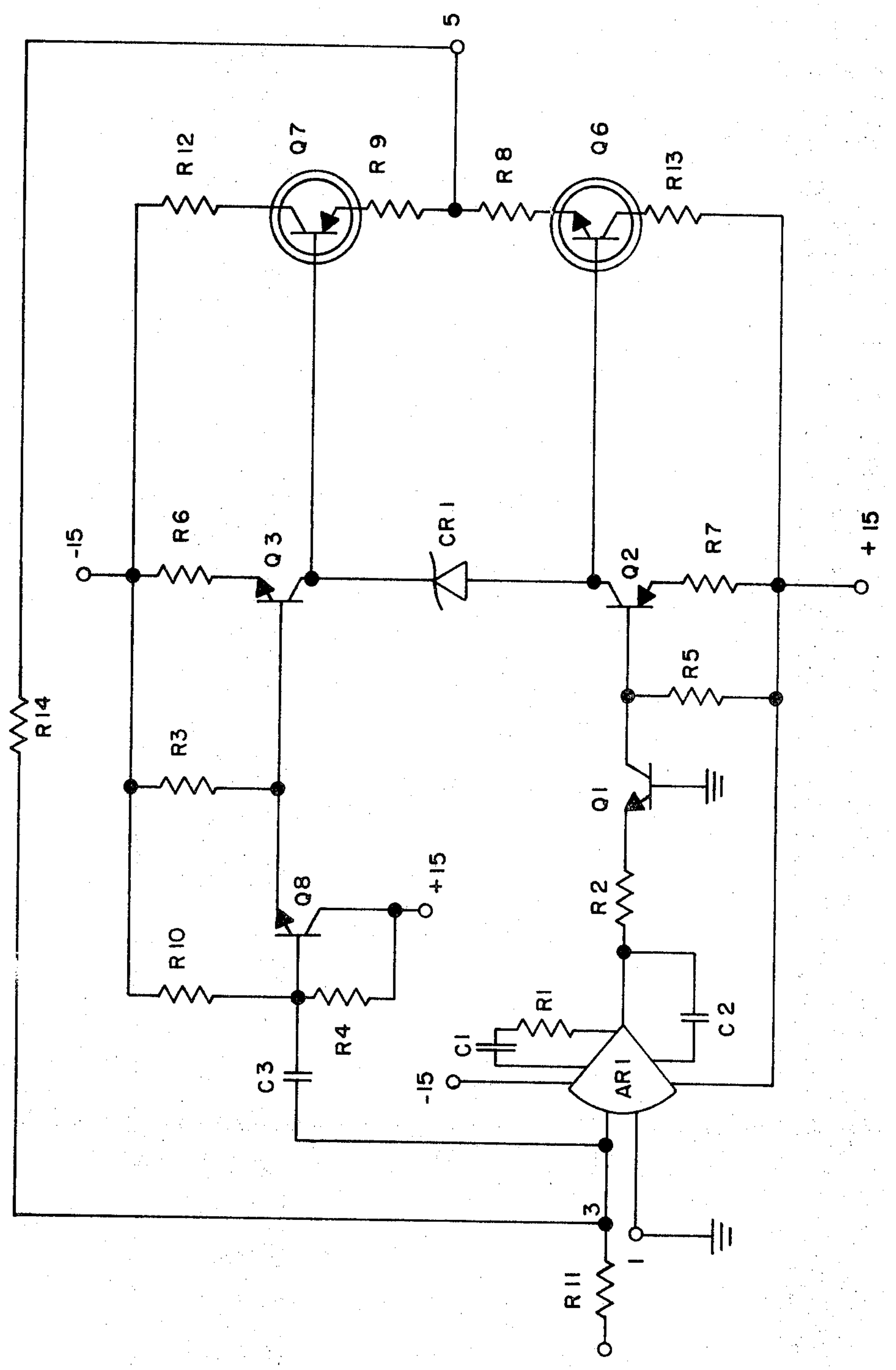

United States Patent Office 3,533,004

Patented Oct. 6, 1970

3,533,004
FEED FORWARD AMPLIFIER

Ronald W. Embley, Lakewood, N.J., assignor to Electronic Associates Inc., Long Branch, N.J., a corporation of New Jersey Filed Nov. 13, 1968, Ser. No. 775,377
Int. Cl. H03f *3/04, 3/68*
U.S. Cl. 330—21 6 Claims

ABSTRACT OF THE DISCLOSURE

The high frequency response of a low cost monolithic integrated circuit operational amplifier is extended by providing a feed-forward high frequency channel around the operational amplifier. This provides high and low frequency amplification paths characterized by respective amplification transistors in each path acting as current sources for each other as a function of frequency.

This invention relates to the field of operational amplifiers, more particularly, to an operational amplifier employing the feed-forward principle.

The feed-forward principle involves the provision of a high and low frequency path for an input signal so that amplification of the input is a function of its frequency. In this manner, optimum amplification over the entire range of expected input frequencies is obtained since the high and low frequency channels are specially designed to perform desired amplification at their respective frequencies of operation.

The present invention employs the feed-forward concept to improve the response of a low cost integrated circuit amplifier. More specifically, a monolithic integrated circuit differential operational amplifier such as the Motorola, Model 1709 which has poor response when the input frequency exceeds 6 kHz. is modified by the external circuitry of the invention to increase the response range to 10 mHz. Such poor response occurs specifically at maximum input signal amplitude due to the slewing rate limitation of the monolithic operational amplifier. Typical slewing rate values for the operational amplifier are *.2v/s—5v/s* when used with a large amount of feedback (i.e. a closed loop gain of unity).

The extended response is accomplished by connecting a low frequency amplification channel between the output of the integrated circuit amplifier and an output circuit. A high frequency amplification channel is connected between the signal input terminal of the integrated circuit amplifier and the output circuit. These connections enhance the high frequency performance of the integrated circuit amplifier while retaining the very low frequency to direct current response of an operational amplifier.

It is an object of the present invention to enhance the frequency performance of a low cost integrated circuit operational amplifier.

Another object of the present invention is the provision of a high performance operational amplifier at very low cost.

These as well as further objects and advantages of the invention will become apparent to those skilled in the art from a reading of the following specification reference being made to the accompanying drawing in which:

The single figure is a schematic diagram of the preferred embodiment of the invention.

In the drawing, numeral 3 denotes the inverting input of a monolithic integrated circuit differential operational amplifier AR1, such as the aforementioned Motorola Model 1709. The non-inverting input 1 is grounded. Resistor R1 and capacitors C1 and C2 provide frequency compensation for the integrated circuit amplifier, thereby determining the roll off frequency for AR1.

The output of amplifier AR1 is connected to a level shifter consisting of NPN transistor Q1 and resistors R2 and R5. This allows the output voltage of amplifier AR1 to be nominally zero while driving a gain stage including transistor Q2 with an emitter voltage close to +15 volts. The level shifter operates as follows: R2 and R5 are chosen of equal value to give unity voltage gain and as Q1 is connected in the common base configuration, the emitter current of Q1 is equal to its collector current. This results in the junction of the emitter of Q1 and R5 being held at 13.5 volts. As the output voltage of amplifier AR1 changes, a corresponding change will occur in the 13.5 volt signal at the emitter of transistor Q1.

Transistors Q2 and Q3 are connected in the common emitter configuration, thus resulting in high voltage gain with 180° phase inversion. At low frequency (i.e. frequencies below the corner frequency of the high pass filter formed by C3 and R10), transistor Q3 functions as a constant current source for transistor Q2.

The high frequency channel is connected to terminal 3. This channel includes a high pass filter comprised of capacitor C3 and resistors R4 and R10. The output of the filter is connected to the base of NPN transistor Q8. The emitter of transistor Q8 is connected to the base of another NPN transistor Q3. Bias for this channel is provided from a +15 volt source at the collector of Q8 and a —15 volt source at the emitter of Q3. Resistor R3 serves as the load for transistor Q8 while R6 determines the collector current of transistor Q3.

The collectors of transistors Q3 and Q2 are coupled via a stabistor CR1.

At low frequencies the input signal at terminal 3 is blocked by the high pass filter. Transistors Q3 and Q8 are biased ON and are functioning in a static mode. Transistor Q3 thus serves as a constant current source for transistor Q2. The load for transistor Q2 is the output impedance of transistor Q3. This results in high voltage gain in transistor Q2.

The collectors of transistors Q2 and Q3 are connected to an output circuit consisting of transistors Q6 and Q7 connected in the common collector configuration and resistors R8, R9, R12 and R13. Transistors Q6 and Q7 are of opposite conductivity types for providing current amplification on the positive and negative swings of their input signal.

Stabistor CR1 eliminates the cross-over distortion which occurs when one of transistors Q7 or Q8 turns ON and the other turns OFF. More particularly, as transistor 33 serves as current source for transistor Q2, a voltage drop is established across the stabistor which biases transistor Q6 and Q7 in an ON quiescent condition. Resistors R12 and R13 provide short circuit protection for the output transistors while resistors R8 and R9 are current limiting resistors for the output stage.

At a certain value of input frequency, known as the cross-over frequency, the gain the the low frequency channel is equal to the gain in the high frequency channel. This results from the fact that transistor Q1 and transistor Q8 both have unity gains. Transistor Q1 has unity gain because of the equal valued resistors R2 and R5 while transistor Q8 is connected as an emitter follower. Transistors Q2 and Q3 are similar transistors, and resistors R6 and R7 are chosen of equal value.

At an octave above cross-over, the gain of the low frequency channel is one-half of that of the high frequency channel. As frequency rises above the cross-over frequency, the gain in the low frequency channel decreases linearly.

It is to be noted that at the higher frequencies, transistor Q2 now serves as a constant current source for transistor Q3, since its input drive from AR1 is highly attenuated and is essentially no longer part of the signal path. This yields the advantages previously discussed of providing high gain because Q2 acts as a high impedance load for Q3.

Distortion which occurs at frequencies in the region of the cross-over frequency because of the summing of the outputs of transistors Q2 and Q3 are eliminated by degenerative feedback provided by resistor R14, connected between input terminal 3 and output terminal 5. Resistor R11 is the input resistor for the circuit.

I claim:

1. A circuit for extending the frequency response of a monolithic integrated circuit operational amplifier comprising:

a monolithic integrated circuit operational amplifier having an input and an output, a first stage of amplification connected to said input and a second stage of amplification connected to said output, said stages each having output means, a high pass filter connected between said input and said first stage, a level shifter connected between said output and said second stage for permitting said output to function at nominally zero volts while driving said second stage at a higher voltage, and an output circuit including first and second transistors, means connected between said output means and said first and second transistors for preventing distortion in said output circuit, the connection between said output means serving as a current path between said stages.

2. In combination with a monolithic integrated circuit amplifier characterized by poor response at high signal frequencies, and having an input and an output, high frequency and low frequency amplification channels, said high frequency channel connected so as to bypass said amplifier and said low frequency channel connected to the output of said amplifier, means connected between the high and low frequency channels whereby current is provided between channels as a function of frequency, and output means connected to said channels for providing a balanced output at all frequencies.

3. The combination of claim 2 wherein said high frequency channel includes a high pass filter connected to the input of said amplifier, a unity gain stage connected to the output of said filter, and an amplification stage connected between said unity gain stage and said output means, said low frequency stage includes a level shifter connected to the output of said amplifier, and an amplification stage connected to said level shifter and said output means, and a stabistor connected between said amplification stages.

4. The combination of claim 3 wherein said amplification stages include similar transistors of opposite polarity.

5. The combination of claim 4 wherein said output means includes similar opposite polarity transistors, each having at least an input electrode and an output electrode, said input electrodes being connected across said stabistor and said output electrodes being connected to an output terminal.

6. A feed-forward amplifier system for increasing the frequency response of a device comprising:

a monolithic integrated circuit operational amplifier having an input and an output, a high frequency channel connected to said input and a low frequency channel connected to said output, and means connected between said channels whereby said high frequency channel serves as a current source for said low frequency channel at low frequencies, and said low frequency channel serves as a current source for said high frequency channel at high frequencies.

References Cited

UNITED STATES PATENTS 2,760,011 8/1956 Berry ------------ 330—126 X

OTHER REFERENCES

Trapnell, Jr. et al., "Wideband Amplifier," IBM Technical Disclosure Bulletin, vol. 2, No. 5, p. 40, February 1960.

Waldhauer, "Latest Approach to Integrated Amplifier Design," Electronics, May 31, 1963, pp. 24–27.

ROY LAKE, Primary Examiner

S. H. GRIMM, Assistant Examiner

U.S. Cl. X.R.

330—24, 30, 31, 125